(12) United States Patent
Zhang et al.

(10) Patent No.: US 8,406,003 B2
(45) Date of Patent: Mar. 26, 2013

(54) FIXING APPARATUS FOR STORAGE DEVICE

(75) Inventors: Guang-Yi Zhang, Shenzhen (CN); Xiao-Zheng Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 683 days.

(21) Appl. No.: 12/644,016

(22) Filed: Dec. 22, 2009

(65) Prior Publication Data

US 2011/0005068 A1    Jan. 13, 2011

(30) Foreign Application Priority Data

Jul. 8, 2009   (CN) .......................... 2009 1 0304153

(51) Int. Cl.
*H05K 5/00*  (2006.01)
(52) U.S. Cl. .................... 361/755; 361/679.39; 361/809
(58) Field of Classification Search ............ 361/679.37, 361/679.38, 679.39, 755, 807, 809, 810, 361/679.33; 211/26, 26.2; 312/205, 348.3, 312/223.2
See application file for complete search history.

(56) References Cited

U.S. PATENT DOCUMENTS

| | | | | |
|---|---|---|---|---|
| 5,921,644 A | * | 7/1999 | Brunel et al. | 312/223.2 |
| 6,088,221 A | * | 7/2000 | Bolognia | 361/679.37 |
| 6,293,636 B1 | * | 9/2001 | Le et al. | 312/223.2 |
| 6,529,373 B1 | * | 3/2003 | Liao et al. | 361/679.33 |
| 6,885,551 B2 | * | 4/2005 | Chen | 361/679.33 |
| 6,956,737 B2 | * | 10/2005 | Chen et al. | 361/679.39 |
| 7,108,530 B2 | * | 9/2006 | Kimura et al. | 439/218 |
| 7,515,410 B1 | * | 4/2009 | Dingfelder et al. | 361/679.33 |
| 2004/0125556 A1 | * | 7/2004 | Chen et al. | 361/685 |
| 2005/0066346 A1 | * | 3/2005 | Wang et al. | 720/657 |
| 2007/0211422 A1 | * | 9/2007 | Liu et al. | 361/685 |
| 2011/0096493 A1 | * | 4/2011 | Tye et al. | 361/679.33 |
| 2011/0234060 A1 | * | 9/2011 | Wu et al. | 312/111 |

* cited by examiner

*Primary Examiner* — Darnell Jayne
*Assistant Examiner* — Patrick Hawn
(74) *Attorney, Agent, or Firm* — Altis Law Group, Inc.

(57) ABSTRACT

A fixing apparatus includes a frame having two opposite fixing walls to fix a first storage device. The fixing apparatus further includes a supporting arm pivotally connected to the frame. The supporting arm includes a fixing plate rotatable between a first position where a second storage device is capable of being sandwiched between the fixing plate and the second fixing wall of the frame, and a second position where the first storage device is capable of being sandwiched between the fixing walls of the frame.

10 Claims, 8 Drawing Sheets

FIXING APPARATUS FOR STORAGE DEVICE

BACKGROUND

1. Technical Field

The present disclosure relates to a fixing apparatus for different storage devices.

2. Description of Related Art

An electronic device, such as a server, may be required to house a variety of storage device types, such as a 3.5 inch hard disk drive and a 2.5 inch hard disk drive, at different times, to meet the need of different users. Often, a first bracket fitting the 3.5 inch hard disk drive, after installation, can accommodate a detachable second bracket fitting therein for a 2.5 inch hard disk drive. However, attaching or detaching the second bracket is time consuming and inconvenient.

DETAILED DESCRIPTION

Figure 1:
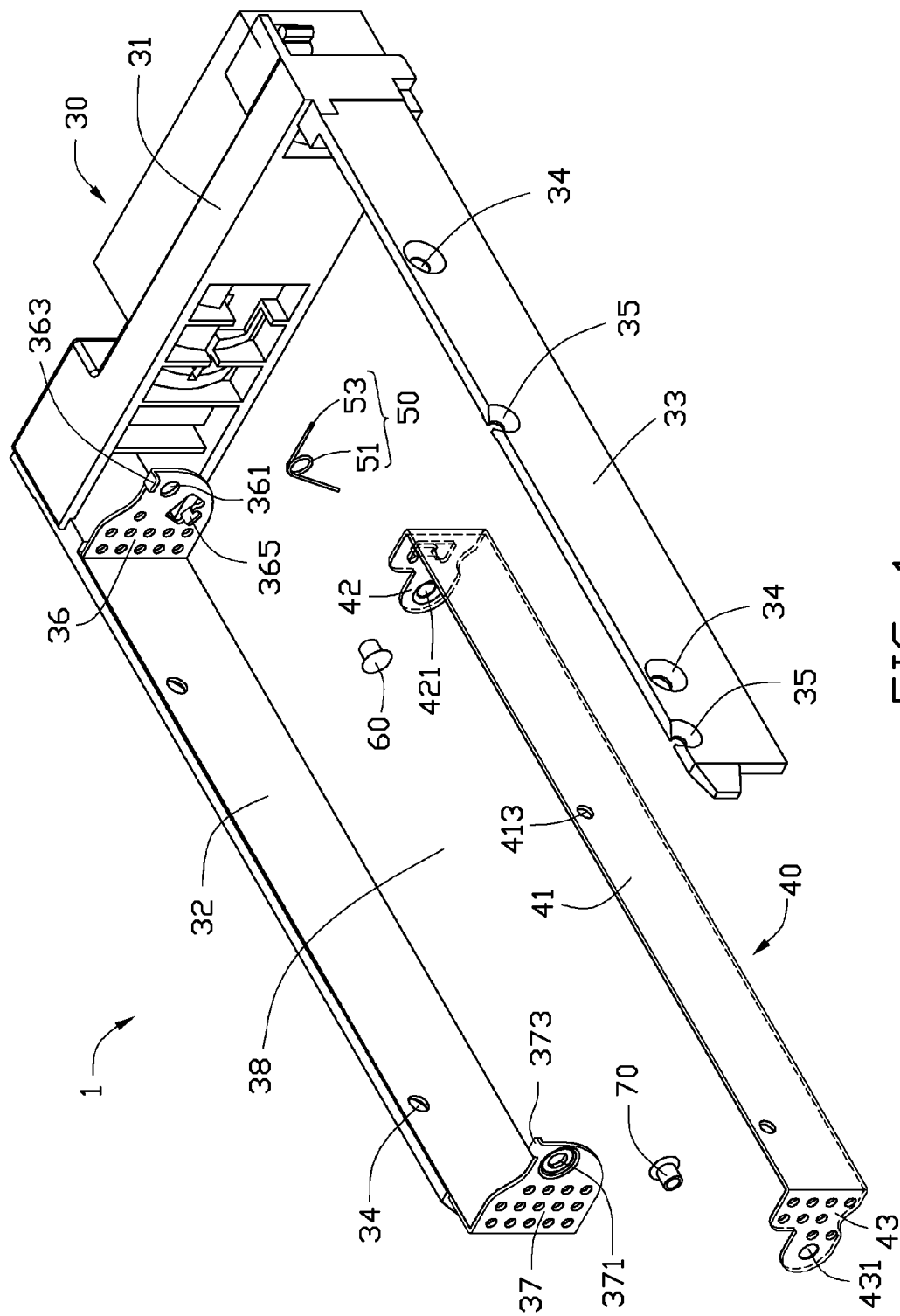
FIG. 1 is an exploded isometric view of an embodiment of a fixing apparatus.
Figure 2:
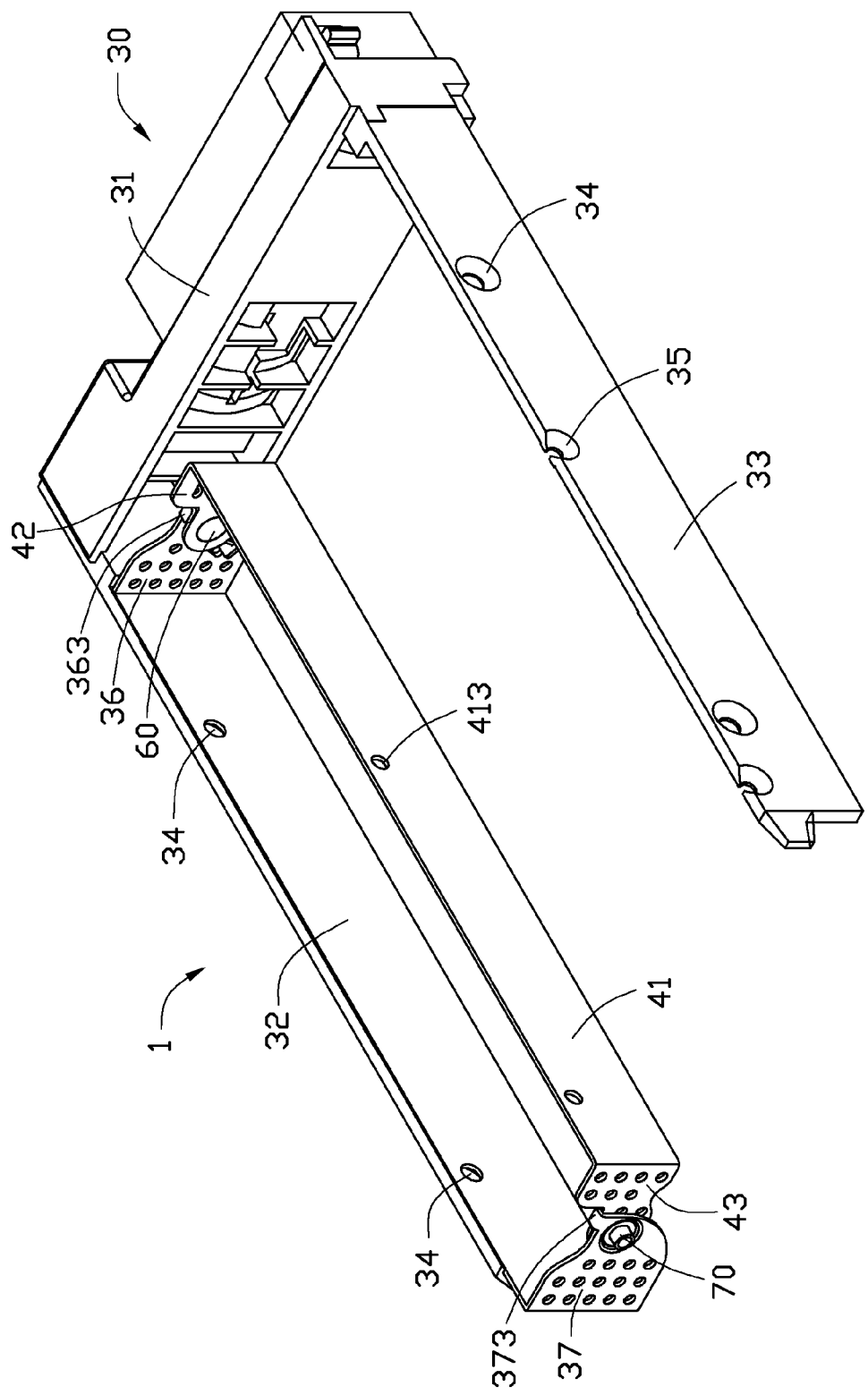
FIG. 2 is an assembled isometric view of the fixing apparatus of FIG. 1.

Referring to FIGS. 1 to 3, and 6, an embodiment of a fixing apparatus 1 is provided for selectively fixing a first storage device 10 or a second storage device 20. The fixing apparatus 1 includes a frame 30, a supporting arm 40, and an elastic member 50. In this embodiment, the first storage device 10 is a 3.5 inch hard disk drive, and the second storage device 20 is a 2.5 inch hard disk drive.

The first storage device 10 includes two opposite sidewalls 11. Two spaced fixing holes 113 are defined in each sidewall 11.

The second storage device 20 includes two opposite sidewalls 21. Two spaced fixing holes 213 are defined in each sidewall 21.

The frame 30 includes an end wall 31, and opposite first and second fixing walls 32 and 33 correspondingly extending from opposite ends of the end wall 31. A receiving space 38 is bounded by the end wall 31, and the first and second fixing walls 32 and 33, for receiving the first storage device 10. The first fixing wall 32 defines two first through holes 34 corresponding to the fixing holes 113 of a corresponding sidewall 11 of the first storage device 10. The second fixing wall 33 defines another two first through holes 34 corresponding to the fixing holes 113 of the other sidewall 11 of the first storage device 10, and two second through holes 35 corresponding to the fixing holes 213 of a corresponding sidewall 21 of the second storage device 20. A first pivot portion 36 and a second pivot portion 37 extend from opposite ends of the first fixing wall 32 towards the second fixing wall 33. The first pivot portion 36 is adjacent to the end wall 31 of the frame 30, and the second pivot portion 37 is away from the end wall 31. A pivot hole 361 is defined in the first pivot portion 36, and a stop plate 363 extends from a top of the first pivot portion 36 towards the second pivot portion 37. The second pivot portion 37 defines a pivot hole 371, and a stop plate 373 extends from a top of the second pivot portion 37 towards the first pivot portion 36. A hook 365 protrudes from the first pivot portion 36, adjacent to the pivot hole 361 and facing the second pivot portion 37.

The supporting arm 40 includes an elongated fixing plate 41, and opposite first and second connecting portions 42 and 43 correspondingly extending in the same direction from opposite ends of the fixing plate 41. Two second through holes 413 are defined in the fixing plate 41, corresponding to fixing holes 213 of the other sidewall 21 of the second storage device 20. The first connecting portion 42 defines a pivot hole 421. The second connecting portion 43 defines a pivot hole 431. A latch 425 (as shown in FIG. 4) is disposed on an outer side of the first connecting portion 42, away from the second connecting portion 43.

The elastic member 50 is a torsion spring, and includes a main body 51, and two elastic feet 53 extending from the main body 51.

During installation of the fixing apparatus 1, a fastener 60 extends through the pivot hole 421 of the first connecting portion 42 of the supporting arm 40, and the main body 51 of the elastic member 50, and is received in the pivot hole 361 of the first pivot portion 36 of the first fixing wall 32 of the frame 30. A fastener 70 extends through the pivot hole 431 of the second connecting portion 43 of the supporting arm 40, and is received in the pivot hole 371 of the second pivot portion 37 of the first fixing wall 32 of the frame 30. Thereby, the supporting arm 40 is pivotally connected to the frame 30. One foot 53 of the elastic member 50 engages the latch 425 of the first connecting portion 42 of the supporting arm 40, and the other engages the hook 365 of the first pivot portion 36 of the frame 30. The elastic member 50 is deformed and exerts upward force on the supporting arm 40, locating the fixing plate 41 of the supporting arm 40 between the first and second fixing walls 32 and 33, and tops of the first and second connecting portions 42 and 43 of the supporting arm 40 correspondingly abut the stop plates 363 and 373 of the first and second pivot portions 36 and 37 of the frame 30. The fixing plate 41 of the supporting arm 40 is located at an original position, parallel to the first and second fixing walls 32 and 33. A distance between the fixing plate 41 and the second fixing wall 33 is equal to the width of the second storage device 20.

Figure 3:
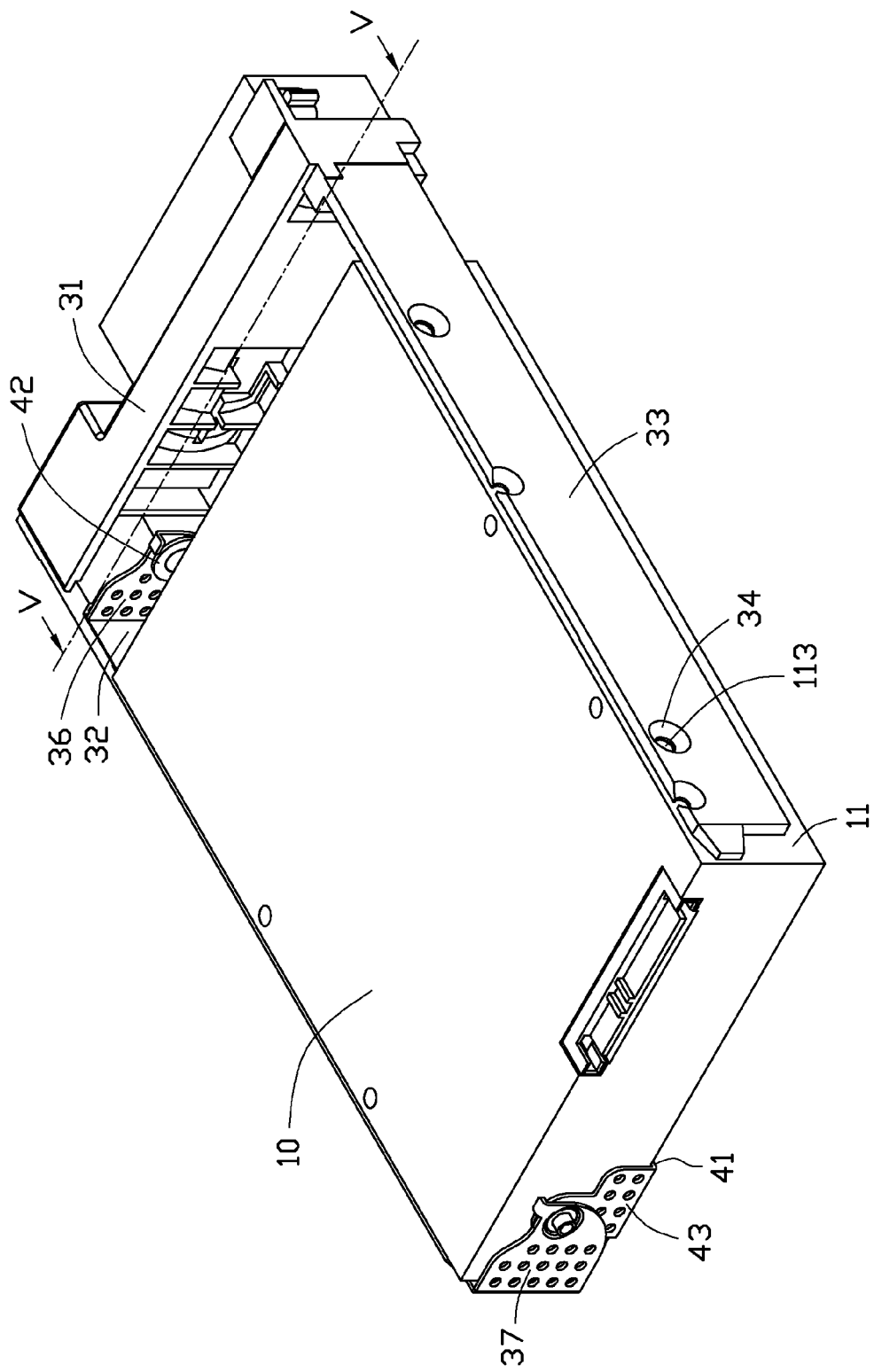
FIG. 3 is similar to FIG. 2, but showing the fixing apparatus fixing a first storage device.
Figure 4:
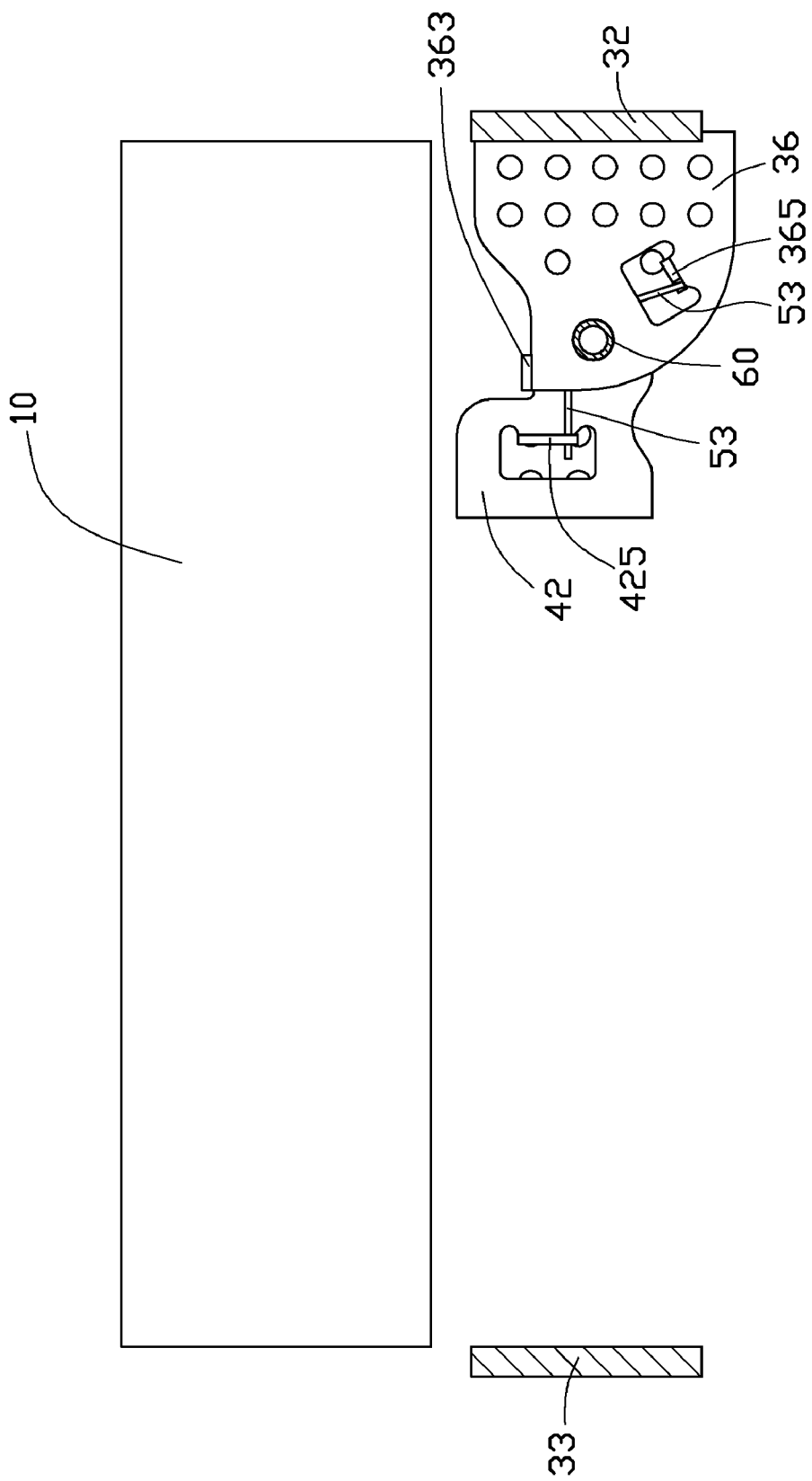
FIGS. 4 and 5 are cross-section views taken along the line V-V of the fixing apparatus and the first storage device of FIG. 3, showing different installation states.
Figure 5:
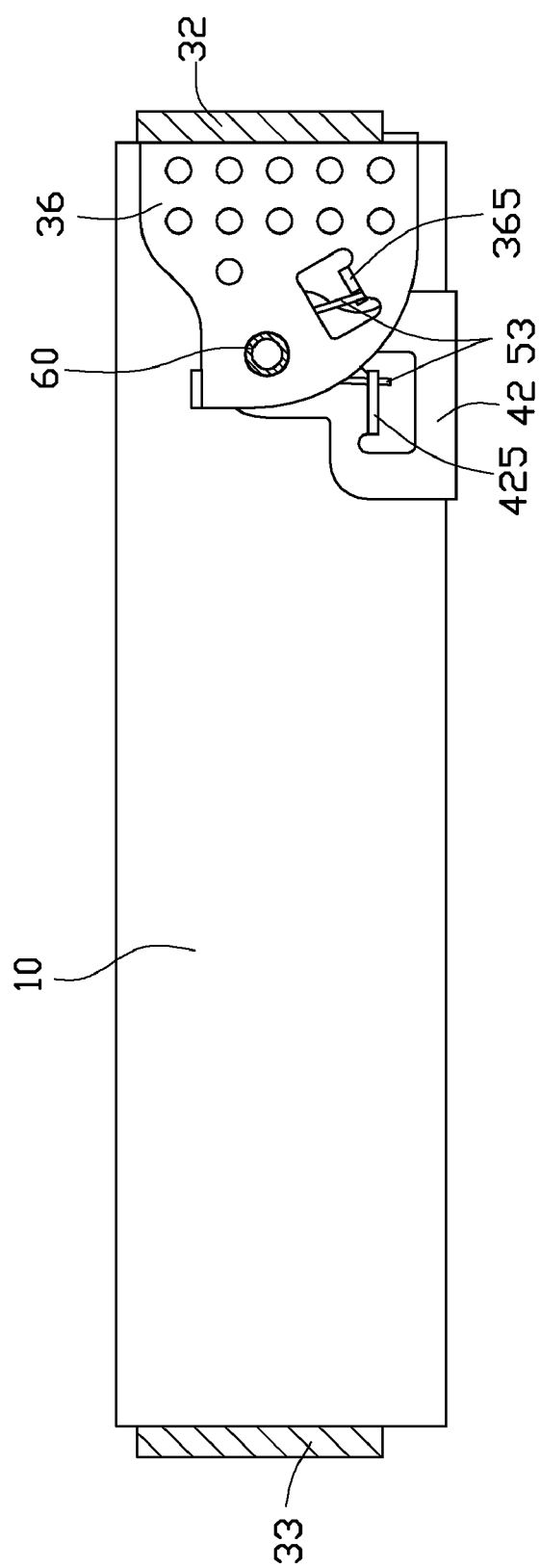

Referring to the FIGS. 3 to 5, during installation of the first storage device 10, the first storage device 10 is lowered onto the top of the fixing plate 41, rotating the supporting arm 40 downward from the original position and deforming elastic member 50, until the fixing plate 41 exits from the receiving space 38 perpendicular to the first and second fixing walls 32 and 33 of the frame 30. The first storage device 10 is received in the receiving space 38 and supported by the fixing plate 41 of the supporting arm 40. Opposite ends of the first storage device 10 correspondingly engage the first and second connecting portions 42 and 43 of the supporting arm 40, and the fixing holes 113 of the sidewalls 11 of the first storage device 10 correspondingly align with the first through holes 34 of the first and second fixing walls 32 and 33 of the frame 30. A plurality of fasteners (not shown) correspondingly passes through the first through holes 34 of the first and second fixing walls 32 and 33, and is received in the corresponding fixing holes 113 of the first storage device 10. Thereby, the first storage device 10 is fixed to the fixing apparatus 1.

Figure 6:
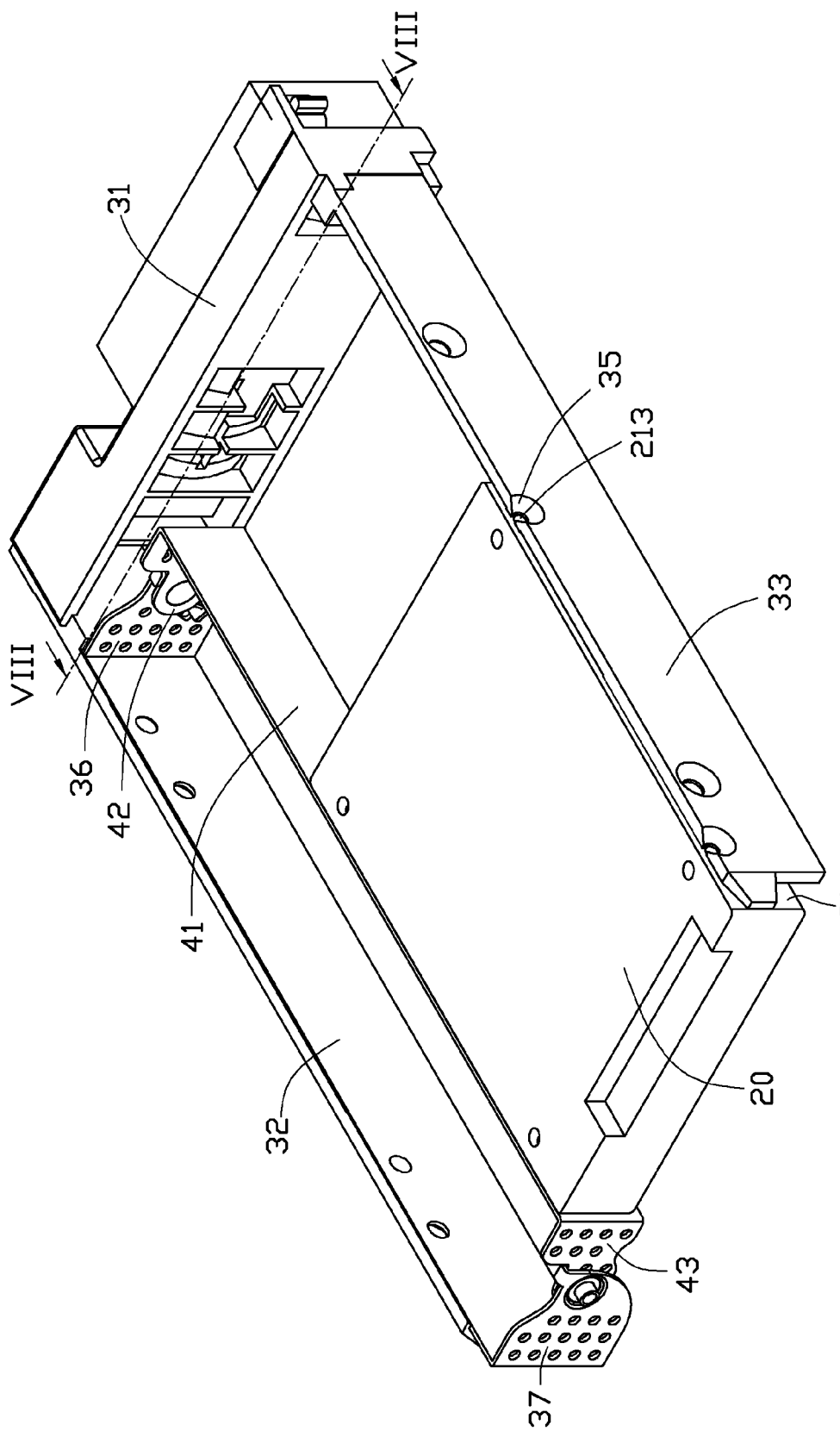
FIG. 6 is similar to FIG. 2, but shows the fixing apparatus fixing a second storage device.
Figure 7:
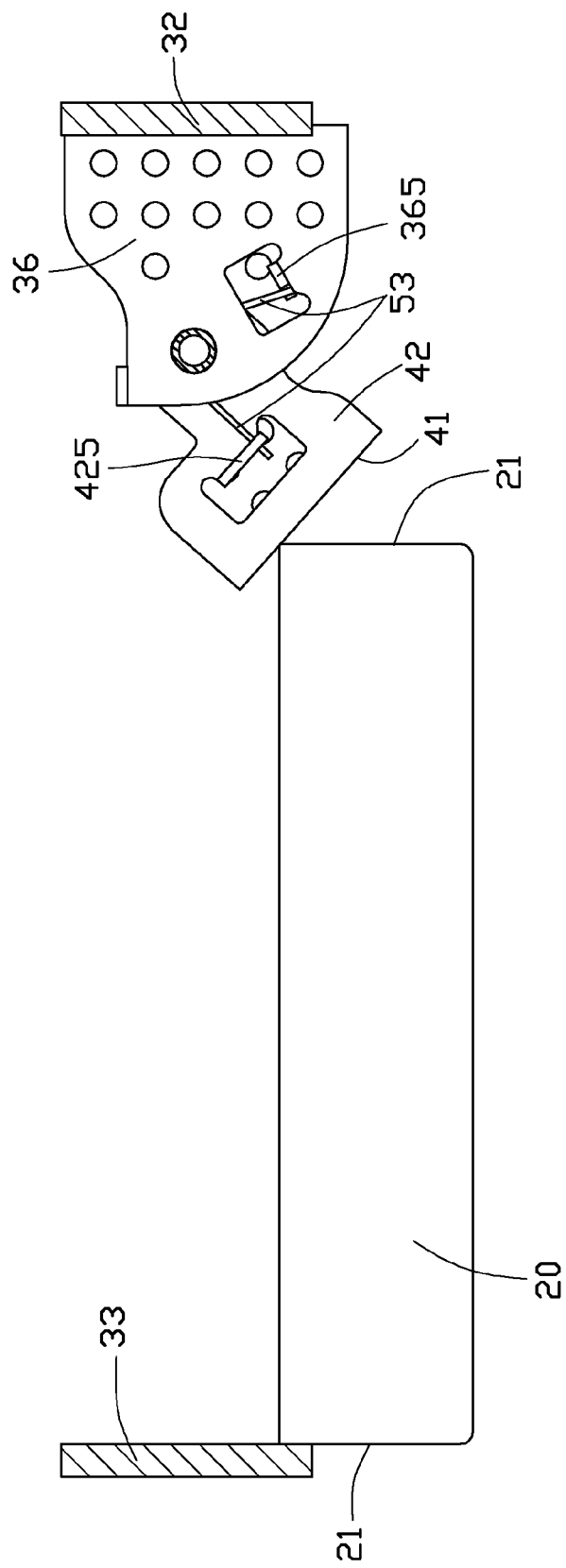
FIGS. 7 and 8 are cross-section views taken along the line VIII-VIII of the fixing apparatus and the second storage device of FIG. 6, showing different installation states.
Figure 8:
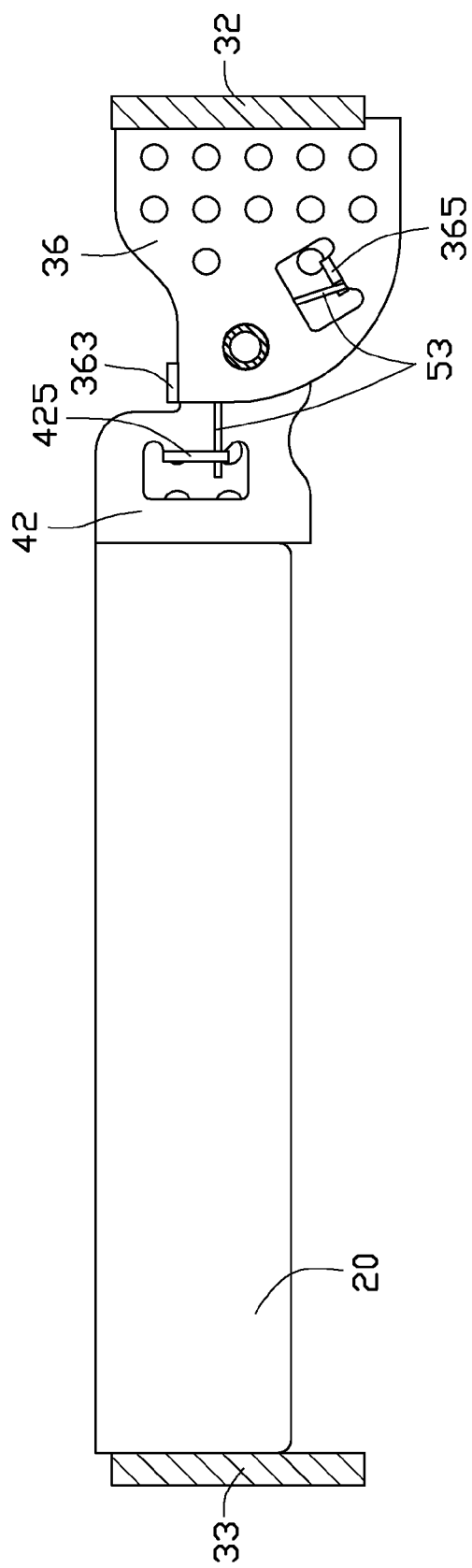

Referring to the FIGS. 6 to 8, during installation of the second storage device 20, the supporting arm 40 is rotated downward by an angle less than 90° from the original position. The second storage device 20 is impelled upward from a bottom of the fixing apparatus 1, with one sidewall 21 engaging a lower portion of the second fixing wall 33, and the other sidewall 21 engaging the fixing plate 41 of the supporting arm 40. The supporting arm 40 is rotated upward by the action of the elastic restoring force of the elastic member 50, until the tops of the first and second connecting portions 42 and 43 of the supporting arm 40 correspondingly abut the stop plates 363 and 373 of the first and second pivot portions 36 and 37 of the frame 30. In this process, the second storage device 20 is slid upward along the second fixing wall 33 and the fixing plate 41, until the second storage device 20 is entirely sandwiched between the second fixing wall 33 and the fixing plate 41. The elastic member 50 is also deformed and applies more upward force than downward force applied by the second storage device 20 on the supporting arm 40, which maintains its original position. The second storage device 20 is impelled along the second fixing wall 33 and the fixing plate 41 towards the end wall 31, until the fixing holes 213 of the sidewalls 21 of the second storage device 20 correspondingly align with the second through holes 35 and 413 of the second fixing wall 33 and the fixing plate 41. A plurality of fasteners (not shown) correspondingly passes through the second through holes 35 and 413 of the second fixing wall 33 and the fixing plate 41, and is received in the corresponding fixing holes 213 of the second storage device 20. Thereby, the second storage device 20 is fixed to the fixing apparatus 1. A rear end of the second storage device 20 is adjacent to a rear end of the fixing apparatus, providing convenient connection to a corresponding connector.

In another embodiment, the second storage device 20 is directly impelled into a space between the second fixing wall 33 of the frame 30 and the fixing plate 41 of the supporting arm 40 from the rear end of the fixing apparatus 1, and is then fixed to the fixing apparatus 1 by a plurality of fasteners. Supporting arm 40 need not be rotated.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A fixing apparatus for selectively fixing a first storage device or a second storage device, the fixing apparatus comprising:
   a frame comprising an end wall and opposite first and second fixing walls correspondingly extending from opposite ends of the end wall, wherein a receiving space bounded by the end wall and the first and second fixing walls receives the first storage device, with opposite sidewalls of the first storage device correspondingly fixed to the first and second fixing walls;
   a supporting arm pivotally connected to the frame, the supporting arm comprising a fixing plate rotatable between a first position and a second position, wherein when the fixing plate is in the first position, the fixing plate is received in the receiving space parallel and spaced from the first and second fixing walls, and the fixing plate cooperates with the second fixing wall to sandwich the second storage device therebetween; and when the fixing plate is in the second position, the fixing plate is out of the receiving space, allowing the first storage device to be sandwiched between the first and second fixing walls; and
   an elastic member connected between the supporting arm and the frame, biasing the supporting arm to retain its first position when there is no storage device mounted to the fixing apparatus, wherein a first pivot portion and a second pivot portion extend from the first fixing wall towards the second fixing wall, each of the first and second pivot portions defines a pivot hole, the supporting arm further comprises opposite first and second connecting portions correspondingly extending from opposite ends of the fixing plate, each of the first and second connecting portions defines a pivot hole, and two fasteners correspondingly extend through the pivot holes of the first and second connecting portions of the supporting arm, and are received in the pivot holes of the corresponding first and second pivot portions of the first fixing wall of the frame.

2. The fixing apparatus of claim 1, wherein a first stop plate extends from the first pivot portion towards the first connecting portion, and a second stop plate extends from the second pivot portion towards the second connecting portion, wherein when the supporting arm is in the first position, the elastic member biases the first and second connecting portions of the supporting arm to correspondingly abut the first and second stop plates.

3. The fixing apparatus of claim 1, wherein the elastic member is a torsion spring comprising a main body placed around the fastener connected between the first pivot portion and the first connecting portion, and two feet extending from the main body and correspondingly engaging the first pivot portion and the first connecting portion.

4. The fixing apparatus of claim 1 wherein each of the first and second fixing walls of the frame defines two first through holes, to correspondingly align with fixing holes of the sidewalls of the first storage device.

5. The fixing apparatus of claim 1, wherein each of the second fixing wall and the fixing plate defines two second through holes, to correspondingly align with fixing holes of opposite sidewalls of the second storage device.

6. The fixing apparatus of claim 1, wherein the fixing plate is operable to be perpendicular to the first and second fixing walls of the frame when the supporting arm is in the second position, to support the first storage device.

7. A fixing apparatus for selectively fixing a first storage device or a second storage device, each of the first and second storage devices comprising two opposite sidewalls, and each sidewall defining two fixing holes, the fixing apparatus comprising:
   a frame comprising a first fixing wall and a second fixing wall parallel to the first fixing wall, wherein a receiving space is bounded by the first and second fixing walls, each of the first and second fixing walls defines two first through holes corresponding to the fixing holes of the sidewalls of the first storage device, the second fixing wall defines two second through holes corresponding to the fixing holes of one sidewall of the second storage device;
   a supporting arm movably connected to the frame, the supporting arm comprising a fixing plate movable between a first position and a second position, the fixing plate defining two second through holes corresponding to the fixing holes of the other sidewall of the second storage device, wherein when the fixing plate is in the first position, the fixing plate is received in the receiving space parallel and spaced from the first and second fixing walls; and when the fixing plate is in the second position, the fixing plate is out of the receiving space; and an elastic member connected between the supporting arm and the frame, the elastic member applying a force on the supporting arm to retain the supporting arm in the first position when there is no storage device mounted to the fixing apparatus, wherein a first pivot portion and a second pivot portion extend from the first fixing wall towards the second fixing wall, each pivot portion defining a pivot hole, and the supporting arm further comprises opposite first and second connecting portions correspondingly extending from opposite ends of the fixing plate, each of the first and second connecting portions defining a pivot hole, two fasteners correspondingly extend through the pivot holes of the first and second connecting portions of the supporting arm, and are received in the pivot holes of the corresponding first and second pivot portions of the first fixing wall of the frame, to pivotably mount the supporting arm to the first fixing wall.

8. The fixing apparatus of claim 7, wherein a first stop plate extends from the first pivot portion towards the first connecting portion, and a second stop plate extends from the second pivot portion towards the second connecting portion, the first and second stop plates correspondingly stop the first and second connecting portions, and prevent the supporting arm to further rotate away from the first position by the force of the elastic member.

9. The fixing apparatus of claim 7, wherein the elastic member is a torsion spring comprising a main body placed around the fastener connected between the first pivot portion and the first connecting portion, and two feet extending from the main body and correspondingly engaging the first pivot portion and the first connecting portion.

10. The fixing apparatus of claim 7, wherein the fixing plate is operable to be perpendicular to the first and second fixing walls of the frame when the supporting arm is in the second position.

* * * * *